United States Patent [19]
Bendz et al.

[11] 3,930,857
[45] Jan. 6, 1976

[54] RESIST PROCESS

[75] Inventors: Diana Jean Bendz; Gerald Andrei Bendz, both of Pine Bush; Anne Marie Wildman, Poughkeepsie, all of N.Y.

[73] Assignee: International Business Machines Corporation, Armonk, N.Y.

[22] Filed: May 3, 1973

[21] Appl. No.: 357,061

[52] U.S. Cl. .............. 96/36.2; 156/12; 156/17; 427/82; 427/96; 427/259
[51] Int. Cl.² ......................................... G03C 5/00
[58] Field of Search .......... 96/44, 35.1, 36.2; 156/3, 156/7, 8, 12, 17, 18, 13; 427/43, 259, 82, 96

[56] References Cited
UNITED STATES PATENTS

| | | | |
|---|---|---|---|
| 3,152,938 | 10/1964 | Osifchin et al. | 156/7 |
| 3,458,311 | 7/1969 | Alles | 96/35.1 |
| 3,535,137 | 10/1970 | Haller et al. | 117/8 |
| 3,600,243 | 8/1971 | LaRocque et al. | 156/3 |
| 3,649,393 | 3/1972 | Hatzakis | 156/12 |
| 3,730,717 | 5/1973 | Fu Hua Chu et al. | 96/27 R |
| 3,756,827 | 9/1973 | Teh-Lin Chang | 96/86 P |

OTHER PUBLICATIONS
IBM Technical Disclosure Bulletin, "Polymer Patterns", Levi et al., Vol. 10, No. 7, Dec. 1967, p. 867.

*Primary Examiner*—William A. Powell
*Assistant Examiner*—Brian J. Leitten
*Attorney, Agent, or Firm*—David M. Bunnell

[57] ABSTRACT

A resist mask, whose configuration is changed during processing, is formed by varying the exposure energy across a resist layer and then conducting successive development steps using developers having increasing solvent power to remove progressively more of the resist layer with each step.

7 Claims, 18 Drawing Figures ized ceramic substrate illustrating another embodiment of the process of the invention.

RESIST PROCESS

BACKGROUND OF THE INVENTION

This invention relates generally to the formation of resist masks and more particularly to a process for forming different resist mask patterns on integrated circuit substrates using a single exposure and multiple development steps.

The application of photolithography to the manufacture of microminiaturized integrated circuit components is well known in the art. A layer of resist material, which usually comprises a polymer with additives such as, for example, radiation sensitizers, plasticizers and adhesion promotors, is coated onto the substrate. The substrate can be either a semiconductor wafer from which integrated circuit chips are formed or a module used to support and interconnect the semiconductor integrated circuit chips. The resist layer is exposed patternwise to electromagnetic radiation such as, for example, light, gamma rays, x-rays, electrons, etc. in order to change the solubility of portions of the resist layer. The resist layer is developed with solvents which remove the more soluble portions of the layer and uncover parts of the substrate for processing. The substrate is then selectively treated by etching or deposition processes as is conventional in semiconductor component manufacture. It is often necessary to conduct such treatments in successive steps so that different portions of the substrate are exposed for each treatment. For example, a first resist layer is patterned, the exposed portions of the substrate processed, and the first resist layer is removed; the substrate is then coated with a second layer of resist, a different pattern is formed in the resist, which pattern must be carefully aligned with respect to the previously processed areas of the substrate, and the uncovered areas of the substrate processed. The second resist layer is removed and additional resist patterns are formed, as necessary, with each pattern having to be carefully aligned with all of the proceding patterns so that an operable device is produced. As the degree of miniaturization increases, the alignment problems also increase with a consequent decrease in yields of usable product. We have now discovered a process whereby the number of alignment steps is reduced.

BRIEF SUMMARY OF THE INVENTION

In accordance with this invention, a resist pattern is formed on a substrate by forming a layer of resist on the substrate and exposing the resist layer patternwise while varying the exposure energy across the pattern to form a plurality of exposed regions having differing solubility rates.

The differing solubility rates of portions of the resist layer are used to permit the successive removal of additional portions of the resist layer. In this way, the resist pattern is changed during the processing of the substrate without the need for supplying a new resist layer or an additional exposure step.

The foregoing and other objects, features and advantages of the invention will be apparent from the following more particular description of preferred embodiments of the invention, as illustrated in the accompanying drawings.

DETAILED DESCRIPTION

Figure 1:
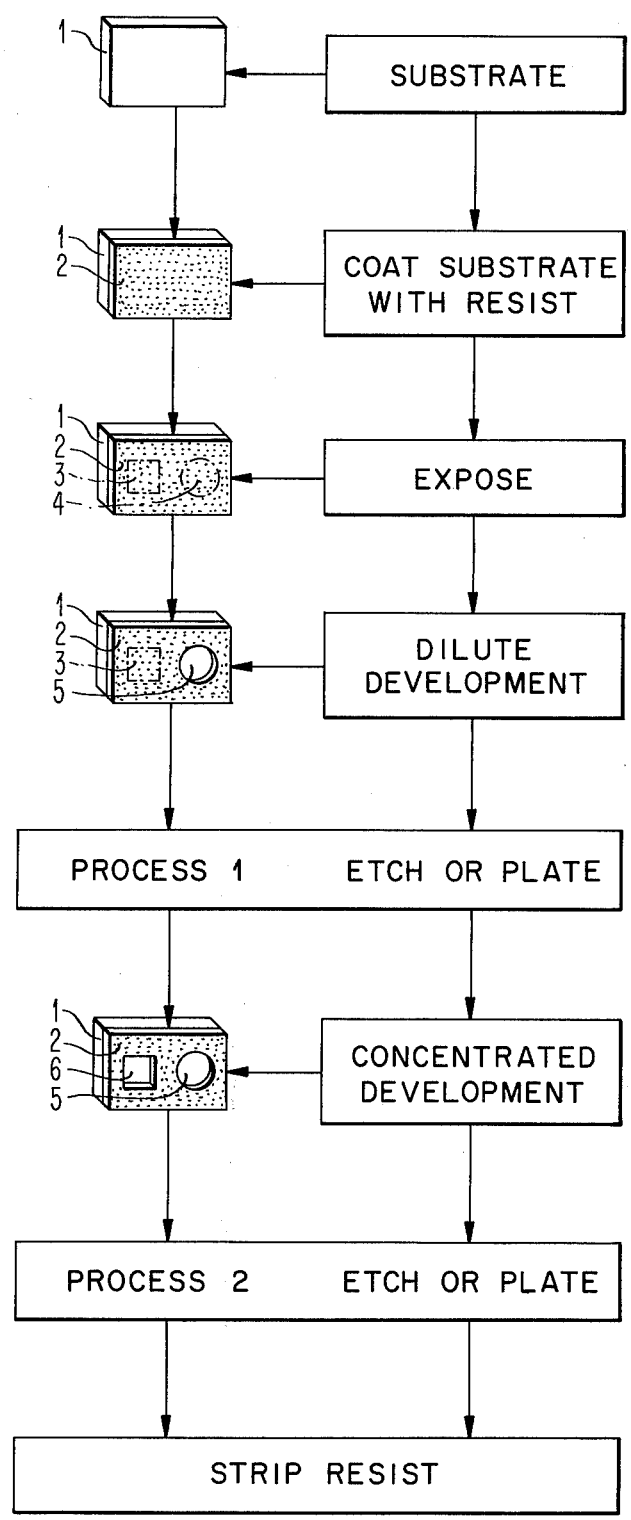
FIG. 1 is a combination plan view and flow chart illustrating a processing sequence in accordance with the invention.

A photochemical reaction is one that is sensitive to energy of radiation. Upon exposure to radiation in a specific wavelength region, the reaction begins and progresses until the radiation is removed or the reaction goes to completion. The degree of completion, then, depends upon the total amount of energy supplied to the photosensitive material during exposure. The variables of exposure include wavelength region, source intensity (I), optical density or percent transmission (%T) of the mask, and time of exposure ($t$). In a conventional photoprocess, these variables are adjusted to provide adequate energy to drive the reaction to completion. The process of the invention adjusts the variables to provide several energy values during a single exposure, thereby driving the reaction to varying degrees of completion. As a result, latent images are produced which can be selectively removed in developers of varying concentrations.

The energy of exposure can be expressed as follows:
$$E = I \times \%T \times t$$
where:
$E$ = exposure energy
$I$ = source intensity
$t$ = exposure time
$T$ = transmission of the mask Because the intensity of the source cannot easily be varied during a single exposure when using a photomask process, nor can the exposure time be varied across the substrate, a change in the exposure energy must depend on a variation in % transmission. This is achieved by fabricating a mask with areas of 0% and 100% $T$ as for a normal mask and in addition, areas of intermediate % transmission. Such a mask, say of 0%, 30% and 100% $T$, when used with a positive resist, would provide areas of three different degrees of reaction completeness and thus three different degrees of solubility in a developer. Areas exposed through 100% $T$ are easily soluble in a dilute developer. Areas exposed through 30% $T$ would not be easily soluble in the dilute developer and will remain until exposed to concentrated developer. Those areas not exposed (0% $T$) would remain until the normal stripping procedure. Masks having more than one intermediate % transmission can be used with additional intermediate development steps to provide a plurality of resist patterns from one exposure.

The process parameters with respect to resist coating, resist thickness, prebaking and any pretreatments are determined normally as in conventional resist processes. To determine the exposure time, an optimum resist thickness is chosen depending upon the type of surface to be processed and the pattern resolution required as is known in the art.

Once an optimum resist thickness is chosen, an exposure time is determined which will result in adequate conversion. Exposure times using an ultraviolet source of 10,000 foot candles intensity normally will be from about 5 to 60 seconds. In the case of two development steps, the objective is to achieve two degrees of conversion during exposure by providing two exposure energies. In order to determine these energies, equation (1) is useful in the following form:

$$E/I = \%T \times t$$

There are three critical values of $E/I$ which must be determined for a given resist thickness:
1. MINIMUM A, the minimum value at which the resist exposed at 100% T is soluble in dilute (30%) developer.
2. MINIMUM B, the minimum value at which the resist exposed at less than 100% T is soluble in undiluted developer.
3. MAXIMUM B, the value at which the resist exposed at less than 100% T becomes soluble in dilute developer.

Minimum A is used to establish the minimum exposure time for a given resist thickness and given dilute developer. For example, for MINIMUM A, when an alkali soluble positive photoresist comprising a photosensitive composition including a diazoketone sensitizer, the 2-diazo-1-oxo-naphthalene-5-sulfonic acid ester of 2,3,4-trihydro-oxbenzophenone and a meta-cresol formaldehyde novolak resin having an average molecular weight of about 1,000 dissolved in a solvent of about 80% ethyl cellosolve acetate, about 10% n-butyl acetate and about 10% xylene is spun at 2500 rpms on a chrome surface and developed in 30% developer, the value of $E/I$ is 16 seconds (%), i.e., $E/I = 16$ seconds (%) = % $T \times t$. Because $E/I = 16$ seconds (%) = 100% × $t$. Solving for $t$, it is obvious that 16 seconds is the minimum exposure time to render these areas soluble in 30% developer. The undiluted developer is an aqueous alkaline solution of about 5% by weight solids comprising a mixture of meta-silicate and sodium phosphate, predominantly sodium ortho phosphate having a pH of about 13. The MINIMUM B and MAXIMUM B were determined to be 6.8 seconds (%) and 13.0 seconds (%) respectively. Using the equation and the minimum time of 16 seconds, the range of transmissions of the intermediate area may be determined:

MIN B : $E/I = 6.8$ seconds (%) = % $T \times 16$ seconds
% $T = 43$

MAX B : $E/I = 13.0$ seconds, (%) = % $T \times 16$ seconds
% $T = 81$

Thus for the above resist, spun at 2500 rpm, the minimum exposure time is 16 seconds and the mask must include an intermediate optical density which lies between 43% $T$ and 81% $T$.

The developers specified for the above parameters are 30% and 100%. The diluted developer was set arbitrarily at 30% as this increased process latitude. This concentration can be varied ± 5% with no noticeable processing effects using the above parameters. Parameters can be established in the same manner for other concentrations of developer for example from 30 to 70% dilution and for masks having two intermediate transmissions wherein the first intermediate development would be in from 30–50% developer and the second intermediate development would be in for 50–70% developer. It is necessary to point out that no line deterioration is noted in either the areas exposed through intermediate % $T$ or in areas developed in dilute developer.

Prebaking is as it would be for a normal photoprocess. Postbake, however, must be eliminated until after the second development or eliminated completely. This is actually beneficial in eliminating a process step.

FIG. 1 illustrates a typical processing sequence. Substrate 1 is coated with a layer of photoresist 2 and then is exposed to form square area 3 which is partially exposed and circular area 4 which is completely exposed. Layer 2 is then subjected to a dilute developer which removes layer 2 in area 4 to expose a portion 5 of substrate 1. Portion 5 can then be etched, metallized or have some other type of additive or subtractive process performed on it as is conventional in the art. Layer 2 is then subjected to concentrated developer which removes layer 2 in area 3 to expose portion 6 of substrate 1. Portion 6 of substrate 1 can then be etched, metallized or have some other type of additive or subtractive process performed on it. Portion 5, of course, will likewise be subjected to this second process step. The remaining resist layer 2 is then stripped from the substrate.

Figure 2A:
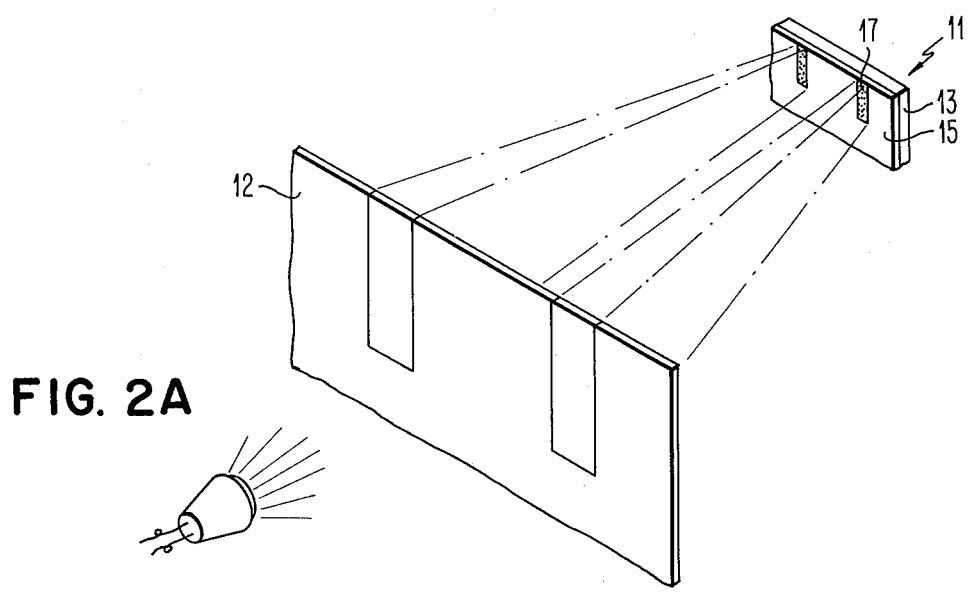
FIGS. 2A–2C schematically illustrate, with parts broken away, the formation of a graded exposure mask having areas of differing optical density which is suitable for carrying out the exposure step of one embodiment of the invention.
Figure 2B:
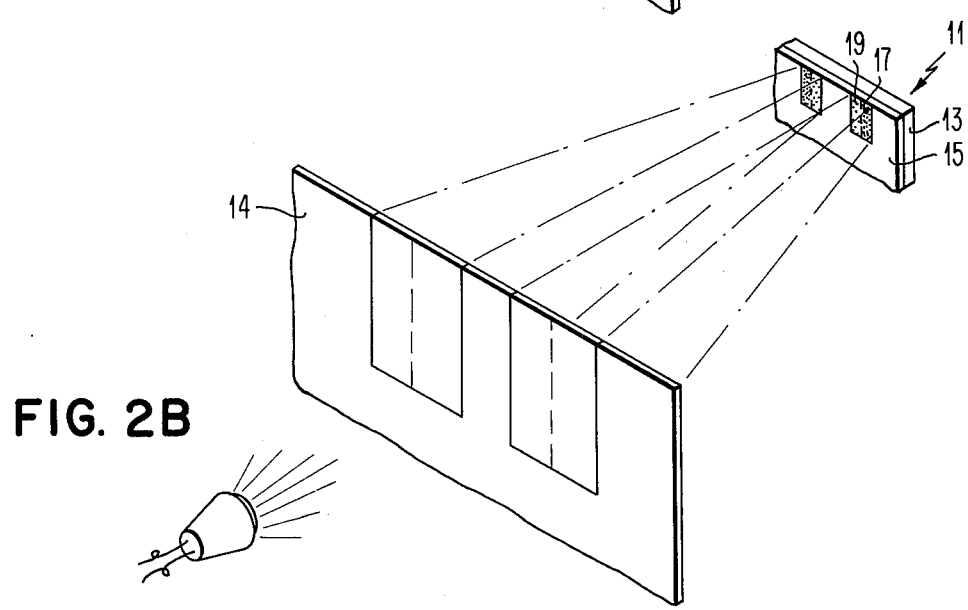
Figure 2C:
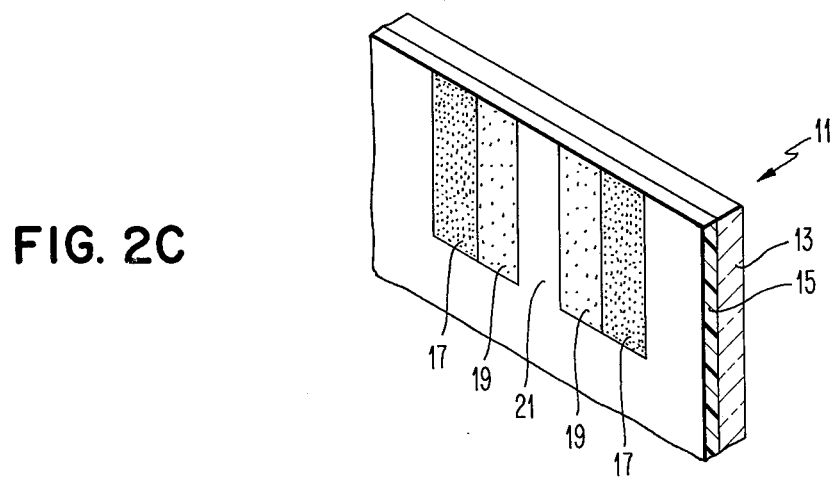

Turning now to FIGS. 2A to 2C, the formation of a tri-density mask 11 is illustrated. A glass plate 13 is coated with a silver halide emulsion layer 15. The layer 15 is exposed through 20 times artwork 12, patternwise for 25 seconds in the areas 17 where full exposure is desired. The layer 15 is then exposed for about 25 seconds through 20 times artwork 14 in the heavily stippled areas 17 where full and the lightly stippled areas 19 where partial exposure is desired. The plate is then developed conventionally to produce a graded mask 11 having fully exposed areas 17 of ideally 0% transmission, partially exposed gray areas 19 of about 50 percent transmission and unexposed clean areas 21 of ideally 100% transmission.

Example 1

FIG. 3 illustrates the formation of a fine metal conductor line ceramic substrate used for interconnecting semiconductor chips using the process of the invention. A chromium layer 21 having a thickness of about 1000 Angstroms is deposited by vacuum evaporation on dielectric substrate 23 which is typically glass or ceramic. In this example, a 92–99% alumina ceramic substrate is used. Next a copper layer 25 having a thickness of about 80,000 Angstroms and a second chromium layer 27 having a thickness of about 2,000 Angstroms are deposited by vacuum evaporation. It should be understood that other conductive metals such as, for example, silver, gold, tantalum, aluminum could be used to form layers 21, 25 and 27. On top of layer 27 is formed a layer 29 of photoresist. In this example, the layer 29 is formed of a positive acting resist which comprises a meta-cresol novolak resin of approximately 1,000 average molecular weight sensitized with a diazo ketone which is the 2-diazo-1-oxo-naphthalene-5-sulfonic acid ester of 2,3,4-trihydroxybenzophenone dissolved in a solvent consisting of about 80 percent ethyl cellosolve acetate, about 10 percent n-butyl acetate, and about 10 percent xylene. The resist is spun onto substrate 23 at about 2500 rpm to give a layer upon removal of solvent having a thickness of about 25,000A. Prebake is for 10 minutes at 95°C. Layer 29 is then exposed to actinic radiation for 25 seconds through the tridensity mask (not shown) which is illustrated in FIG. 2C. The exposure is complete for heavily stippled area 30 and partial for lightly stippled areas 32 and 34. Layer 29 is then developed in alkaline developer which has been diluted to 30% of normal strength with deionized water. The undiluted developer is a buffered aqueous alkaline solution of about 5 percent solids by weight having a pH of about 13.0 and comprising a mixture of sodium meta silicate and sodium phosphate predominantly ortho-phosphate. The development time is about 45–60 seconds and the unexposed portions 33 of layer 29 and the partially exposed portion 32 and 34 of layer 29 remain on chrome layer 27 (FIG. 3C). The chromium and copper layers 25 and 27, which are unprotected by resist, are then etched away to produce the structure shown in FIG. 3D.

Figure 3A:
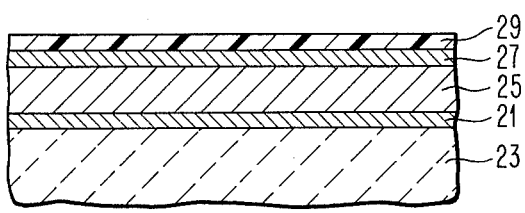
FIGS. 3A–3G are cross-sectional views of a metallized ceramic substrate illustrating an embodiment of the process of the invention.
Figure 3B:
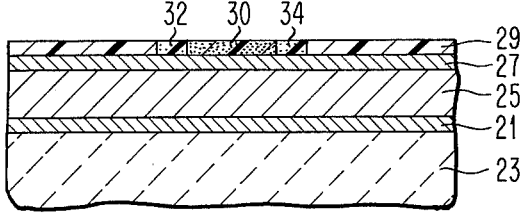
Figure 3C:
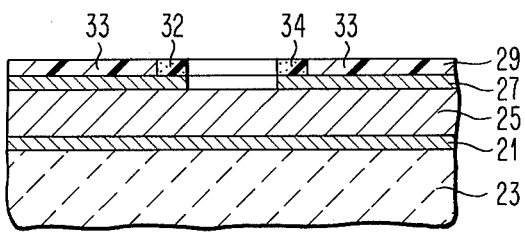
Figure 3D:
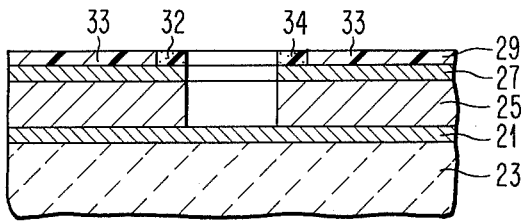
Figure 3E:
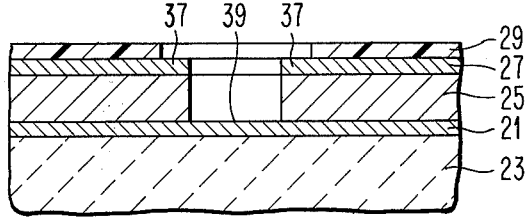
Figure 3F:
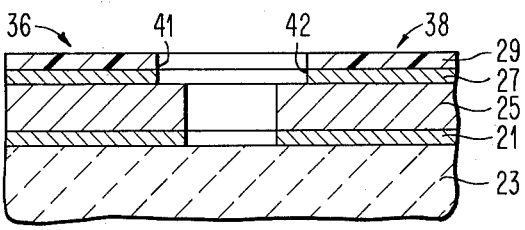
Figure 3G:
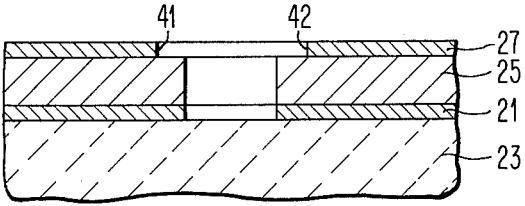

Suitable etchants for chromium are those which do not adversely affect unpostbaked resist. Such etchants are described, for example, in U.S. Pat. No. 3,639,185 and employ an aqueous solution of a salt of a weak organic acid and a strong base and an oxidizing agent. In this example, a mixture of about 6 grams of potassium permanganate and about 26 grams of anhydrous sodium carbonate in 100 ml of deionized water which gives a pH of between 11 and 12 is used at a temperature of 30°–45°C. For copper, an etchant solution of 40 grams of ferric chloride and 0.001 ml. of 37% hydrochloric acid in 100 ml. of water is used at a temperature of about 25°–35°C. The remaining resist layer is then developed with undiluted developer so that the partially exposed portions 32 and 34 are removed as shown in FIG. 3E. The exposed portions 37 and 39 of chromium layers 27 and 21 are then etched away using the selective permanganate etch to produce the structure shown in FIG. 3F having separated chrome-copper chrome islands 36 and 38 wherein the upper chromium layer 27 has steps 41 and 42. This step structure forms suitable solder dams for the attachment of semiconductor chips to the islands and associated conductor lines on substrate 23 during a solder reflow operation. After the second etch, the remaining resist layer 29 is removed with a conventional stripping solvent, for example, a mixture of tetrachloroethylene, dichlorobenzene, phenol, and a Na alkyl naphthalene sulfonate surfactant as shown in FIG. 3G. The above method eliminates a second resist coating and exposing process to form the steps in layer 27, and the geometry of the steps is fixed by the single exposure so that alignment difficulties are avoided.

In Example 2, a combination of etching and deposition is illustrated to provide pads for either wire or chip bonding.

Example 2

Figure 4A:
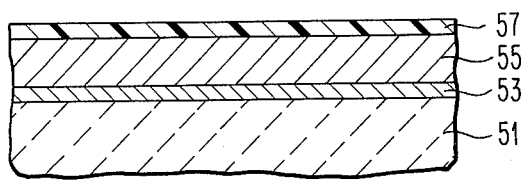
FIGS. 4A–4G are cross-sectional views of a metallized ceramic substrate illustrating another embodiment of the process of the invention.
Figure 4B:
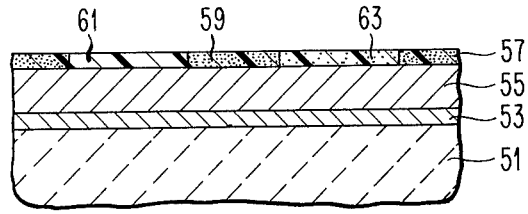
Figure 4C:
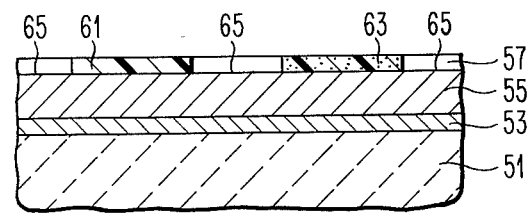
Figure 4D:
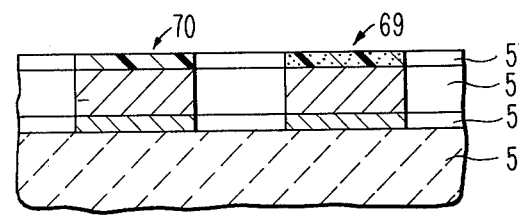
Figure 4E:
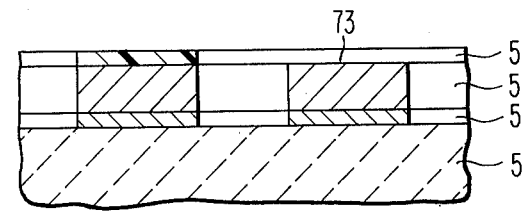
Figure 4F:
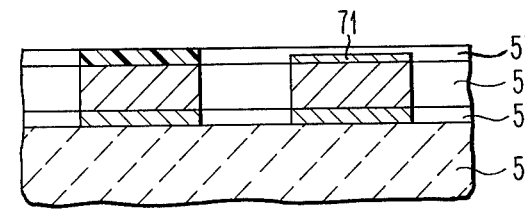
Figure 4G:
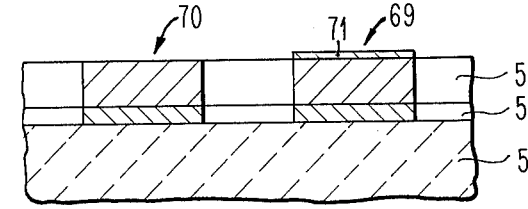

Turning now to FIG. 4A, ceramic substrate 51 which could be ceramic, glazed ceramic, or multilayer ceramic has a layer 53 of chromium and a layer 55 of copper coated thereon. A layer 57 of positive photoresist is coated on top of the copper layer 55. The photoresist is then exposed through a multiple density mask so that heavily stippled areas 59 are completely exposed, areas 61 are unexposed and lightly stippled area 63 is partially exposed as shown in FIG. 4B. The fully exposed areas are then removed by development in dilute solvent to expose areas 65 of the copper layer 55. (FIG. 4C) The unprotected copper and chrome layers are removed by etching to leave pads 69 and 70 still protected by resist layer 57 (FIG. 4D). The remaining resist is then developed with stronger solvent which removes partially exposed area 63 to expose surface 73 of copper layer 55 (FIG. 4E). Gold 71 is then plated on the exposed surfaces 73 of copper layer 55 (FIG. 4F). The remaining resist is then stripped to leave chrome copper pad 70 suitable for chip joining and gold coated chrome copper pads 69 for wire bonding.

The variable energy exposure can also be accomplished by limiting the wavelengths of exposure to low energy wavelengths in certain areas such as by using a colored mask. Where scanning radiation is employed such as by beams of light, atomic particles, or electrons, it is possible to achieve variable energy exposure by controlling either or both the beam intensity and the exposure time.

The use of cross-linking negative resist processes is also within the perview of the process of the invention in which case the critical differential in solubility is between the unexposed and partially exposed resist. The partially exposed areas require sufficient cross-linking energy so that they will be retained during the first development step which removes the unexposed portions of the resist.

Although the invention has been particularly shown and described with reference to preferred embodiments thereof, it will be understood by those skilled in the art that the foregoing and other changes in form and details may be made therein without departing from the spirit and scope of the invention.

We claim:
1. A resist process comprising:
   a. forming a resist layer on a substrate,
   b. exposing said layer patternwise while varying the exposure energy across the pattern to form a plurality of exposed regions in said layer having differing solubility rates,
   c. developing said resist layer with a first developer so as to remove the portions of said layer having the greatest solubility rate from said substrate and form a resist mask having a first configuration,
   d. subjecting the exposed portions of said substrate to a first additive or subtractive treatment with the remainder of said resist layer acting to protect the covered portions of said substrate from the treatment,
   e. developing the resist layer with a second, more concentrated, developer so as to remove the patterns of said layer having the next greatest solubility rate from said substrate to form a resist mask having a second configuration,
   f. subjecting the exposed portions of said substrate to a second additive or subtractive treatment with the remainder of said resist layer acting to protect the covered portions of said substrate from said treatment.

2. The process of claim 1 wherein the exposure step comprises the step of exposing said layer through a graded mask having areas of differing optical density to the transmittal of light.

3. The process of claim 1 wherein said substrate is a dielectric material which is coated with an electrically conductive layer.

4. The process of claim 3 wherein said first and second treatments are etching steps to remove portions of said electrically conductive layer.

5. The process of claim 3 wherein said first treatment is an etching step and said second treatment is a plating step.

6. The process of claim 1 wherein said substrate is a semiconductor device.

7. The process of claim 2 wherein the resist is an alkali soluble positive acting resist containing a meta-cresol formaldehyde novolak resin having an average molecular weight of about 1,000, and a sensitizer which is the 2-diazo-1-oxo-naphthalene-5-sulfonic acid ester of 2,3,4-trihydroxybenzophenone and said developers are aqueous alkaline solutions with said first developer being more dilute in that it contains a lower solids content by weight of alkaline material than said second developer.

* * * * *